(12) United States Patent
Matsuoka et al.

(10) Patent No.: US 12,453,191 B2
(45) Date of Patent: Oct. 21, 2025

(54) SOLAR CELL MODULE

(71) Applicant: KYOCERA CORPORATION, Kyoto (JP)

(72) Inventors: Toshiki Matsuoka, Kizugawa (JP); Yusuke Miyamichi, Hikone (JP); Keita Kurosu, Yokohama (JP); Shoei Sato, Yokohama (JP)

(73) Assignee: KYOCERA CORPORATION, Kyoto (JP)

( * ) Notice: Subject to any disclaimer, the term of this patent is extended or adjusted under 35 U.S.C. 154(b) by 23 days.

(21) Appl. No.: 17/760,002

(22) PCT Filed: Feb. 2, 2021

(86) PCT No.: PCT/JP2021/003697
§ 371 (c)(1),
(2) Date: Aug. 3, 2022

(87) PCT Pub. No.: WO2021/161847
PCT Pub. Date: Aug. 19, 2021

(65) Prior Publication Data
US 2023/0067862 A1 Mar. 2, 2023

(30) Foreign Application Priority Data
Feb. 12, 2020 (JP) ................................ 2020-021427

(51) Int. Cl.
*H10F 19/80* (2025.01)
*H10F 19/85* (2025.01)

(52) U.S. Cl.
CPC .......... *H10F 19/804* (2025.01); *H10F 19/80* (2025.01); *H10F 19/85* (2025.01)

(58) Field of Classification Search
CPC . H01L 31/048; H01L 31/0481; H01L 31/049; H10F 19/80–805
See application file for complete search history.

(56) References Cited

U.S. PATENT DOCUMENTS 5,261,970 A * 11/1993 Landis ................... H10F 77/70
257/E31.13
5,994,641 A * 11/1999 Kardauskas .......... H01L 31/056
136/246

(Continued)

FOREIGN PATENT DOCUMENTS

CN       110073501 A    7/2019
JP       S62261180 A    11/1987

(Continued)

*Primary Examiner* — Lindsey A Buck
(74) *Attorney, Agent, or Firm* — HAUPTMAN HAM, LLP

(57) ABSTRACT

A solar cell module includes a resin first protective layer being light transmissive, a second protective layer, a solar cell portion, a resin first filler layer, a resin second filler layer, a substrate, and an adhesive layer. The solar cell portion includes solar cell elements between the protective layers. The first filler layer facing the first protective layer covers the solar cell elements. The second filler layer facing the second protective layer covers the solar cell elements. The adhesive layer bonds the second protective layer and the substrate. The first protective layer is softer than the substrate. One or more of the second filler layer, the second protective layer, and the adhesive layer have a higher Young's modulus than the first filler layer.

8 Claims, 6 Drawing Sheets

(56) References Cited

U.S. PATENT DOCUMENTS

| | | | |
|---|---|---|---|
| 2004/0003840 A1 | 1/2004 | Umemoto | |
| 2008/0006323 A1* | 1/2008 | Kalkanoglu | H02S 40/20 |
| | | | 156/325 |
| 2009/0272436 A1* | 11/2009 | Cheung | H01L 31/048 |
| | | | 257/E31.001 |
| 2014/0311555 A1* | 10/2014 | Harkema | H01L 31/0481 |
| | | | 136/251 |
| 2015/0295111 A1* | 10/2015 | Blackwood | H10F 19/804 |
| | | | 438/66 |
| 2018/0122972 A1 | 5/2018 | Zheng et al. | |
| 2019/0140121 A1 | 5/2019 | Ueda et al. | |
| 2019/0312164 A1* | 10/2019 | Sugiyama | H01L 31/048 |

FOREIGN PATENT DOCUMENTS

| | | | |
|---|---|---|---|
| JP | 2001250965 A | 9/2001 | |
| JP | 200414791 A | 1/2004 | |
| JP | 20124146 A | 1/2012 | |
| JP | 2013247238 A | 12/2013 | |
| JP | 2015176917 A | 10/2015 | |
| WO | 2017208793 A1 | 12/2017 | |
| WO | WO-2018110582 A1 * | 6/2018 | H01L 31/048 |

\* cited by examiner

SOLAR CELL MODULE

CROSS-REFERENCE TO RELATED APPLICATION

The present application is a National Phase entry based on PCT Application No. PCT/JP2021/003697 filed on Feb. 2, 2021, entitled "SOLAR CELL MODULE", which claims the benefit of Japanese Patent Application No. 2020-021427, filed on Feb. 12, 2020, entitled "SOLAR CELL MODULE".

FIELD

Embodiments of the present disclosure relates generally to a solar cell module.

BACKGROUND

A known solar cell module includes multiple solar cell elements that are planarly arranged between a light-transmissive member and a back member and electrically connected to one another.

In this solar cell module, for example, the multiple solar cell elements are covered with a filler mainly containing ethylene-vinyl acetate (EVA) between the light-transmissive member such as a glass substrate and the back member such as a backsheet.

SUMMARY

A solar cell module is described.

In one embodiment, a solar cell module includes a first protective layer containing a resin, a second protective layer, a solar cell portion, a first filler layer containing a resin, a second filler layer containing a resin, a substrate, and an adhesive layer. The first protective layer has a first surface and a second surface opposite to the first surface and is light transmissive. The second protective layer has a third surface facing the second surface, and a fourth surface opposite to the third surface. The solar cell portion includes one or more solar cell elements between the second surface and the third surface. The first filler layer covers the one or more solar cell elements between the second surface and the solar cell portion. The second filler layer covers the one or more solar cell elements between the third surface and the solar cell portion. The substrate has a fifth surface facing the fourth surface. The adhesive layer bonds the fourth surface and the fifth surface together between the fourth surface and the fifth surface. The first protective layer is softer than the substrate. One or more of the second filler layer, the second protective layer, and the adhesive layer have a higher Young's modulus than the first filler layer.

DESCRIPTION OF EMBODIMENTS

Figure 1A:
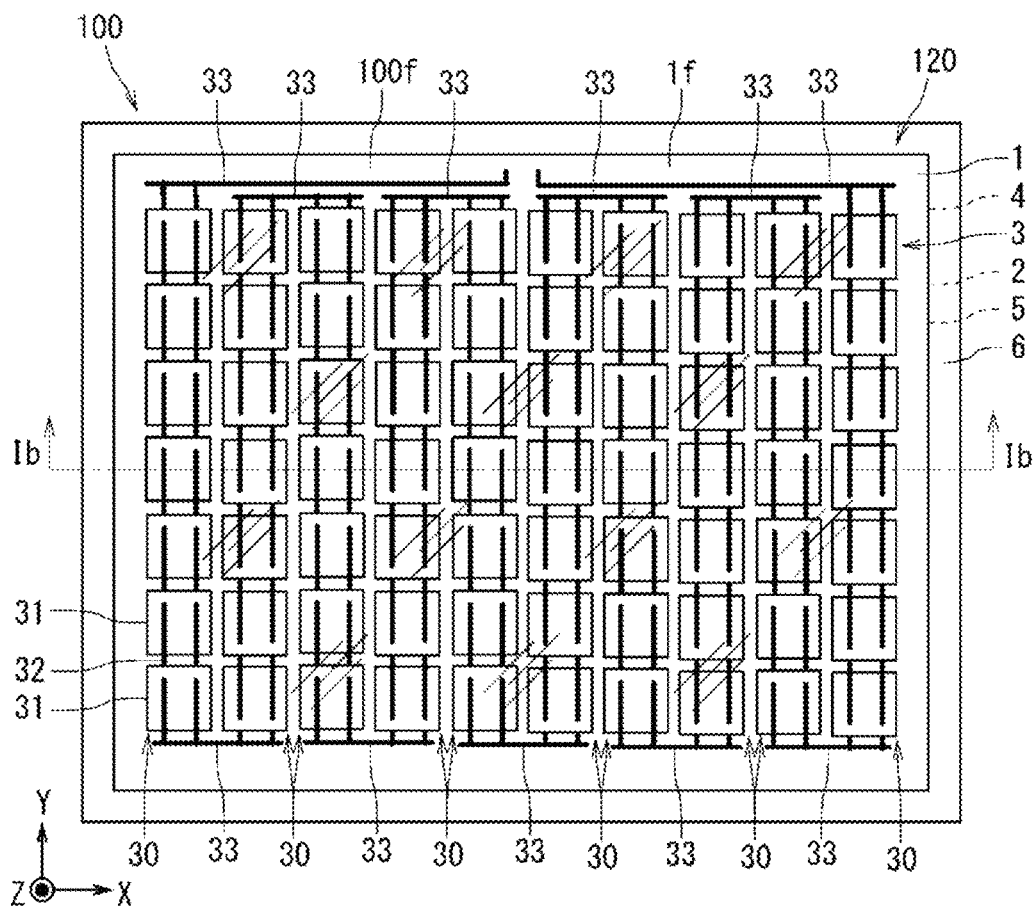
FIG. 1A illustrates a plan view of a solar cell module according to a first embodiment of the present disclosure as viewed in plan, illustrating its example appearance.

A solar cell module includes, for example, a light-transmissive member such as a glass substrate, a back member such as a backsheet, and multiple solar cell elements planarly arranged between the light-transmissive member and the back member and electrically connected to one another. In this solar cell module, a filler such as ethylene-vinyl acetate (EVA) copolymer is filled to cover the multiple solar cell elements between the light-transmissive member and the back member.

In such a solar cell module, for example, the glass substrate as the light-transmissive member may be replaced with a resin member thinner than the glass substrate to reduce the weight of the solar cell module. In this example, the resin member may have a thickness of, for example, one millimeter (mm) or less, whereas the glass substrate has a thickness of, for example, about several millimeters.

However, when, for example, falling objects such as hailstones or flying objects caused by strong winds hit the resin member as the light-transmissive member, which is softer than the glass substrate, the solar cell elements may deform locally and crack. In other words, for example, the resin member is softer than the glass substrate and thus may decrease the impact resistance of the solar cell module. In this case, the solar cell elements with cracks can have, for example, lower photoelectric conversion efficiency, and thus can decrease the output of the solar cell module.

The inventors of the present disclosure have developed a technique for reducing the weight of a solar cell module and increasing its impact resistance.

Embodiments will now be described with reference to the drawings. Throughout the drawings, components with the same or similar structures and functions are given like reference numerals and will not be described repeatedly. The drawings are schematic. FIGS. 1A to 3 and FIGS. 5A to 6B show the right-handed XYZ coordinate system. In this XYZ coordinate system in a solar cell module 100, a direction along a pair of facing sides of a front surface 100$f$ is referred to as the positive X-direction, and a direction along the other pair of facing sides of the front surface 100$f$ is referred to as the positive Y-direction. Also, the normal direction of the front surface 100$f$ orthogonal to both the positive X-direction and the positive Y-direction is referred to as the positive Z-direction.

1. First Embodiment

1-1. Structure of Solar Cell Module

The solar cell module 100 according to a first embodiment will now be described with reference to FIGS. 1A to 3. For example, the solar cell module 100 has a surface (also referred to as a light receiving surface or a front surface) 100f to mainly receive incident light, and a back surface 100b opposite to the front surface 100f. In the first embodiment, the front surface 100f faces in the positive Z-direction. The back surface 100b faces in the negative Z-direction. The positive Z-direction is defined as, for example, a direction toward the sun culminating in the south. In the example illustrated in FIG. 1A, the front surface 100f and the back surface 100b are rectangular.

Figure 1B:
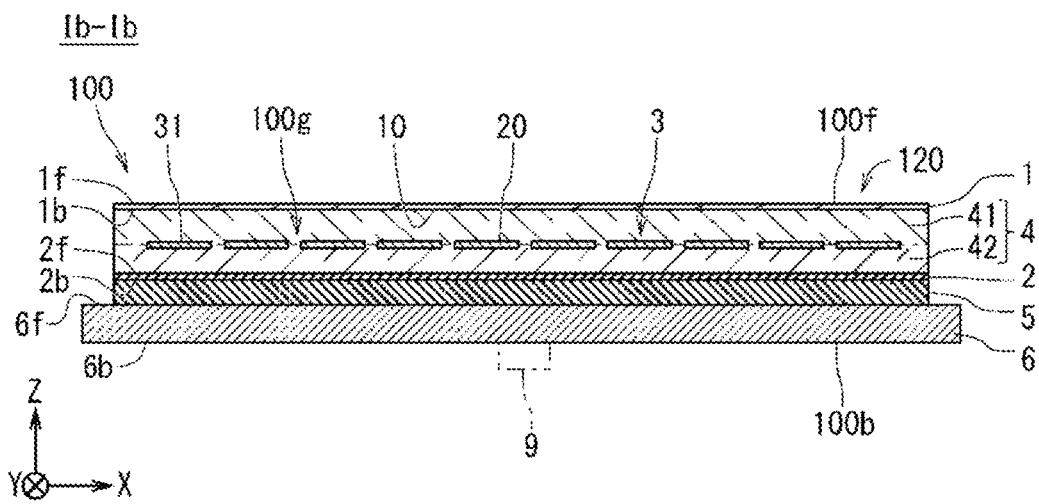
FIG. 1B illustrates an example imaginary cross-sectional view of the solar cell module taken along line Ib-Ib in FIG. 1A.

As illustrated in FIGS. 1A and 1B, the solar cell module 100 includes, for example, a module body 120, an adhesive layer 5, and a substrate 6. The module body 120 includes, for example, a first protective layer 1, a second protective layer 2, a solar cell portion 3, and a filler layer 4. As illustrated in FIG. 1B, the solar cell module 100 may additionally include, for example, a terminal box 9. The terminal box 9 is located, for example, on the back surface 100b of the solar cell module 100. The terminal box 9 can output electricity generated by the solar cell portion 3.

1-1-1. First Protective Layer

The first protective layer 1 (also referred to as a front member or a front surface member) can protect, for example, the solar cell portion 3 through the front surface 100f. The first protective layer 1 has a first surface 1f and a second surface 1b. The second surface 1b is opposite to the first surface 1f. In the first embodiment, the first surface 1f defines, for example, the front surface 100f of the solar cell module 100. In the example in FIGS. 1A and 1B, the first surface 1f faces in the positive Z-direction, and the second surface 1b faces in the negative Z-direction. The first surface 1f is exposed to, for example, the outside (external space) of the solar cell module 100.

The first protective layer 1 is transmissive to light. More specifically, the first protective layer 1 is transmissive to, for example, light at wavelengths in a specified range. The wavelengths in the specified range include, for example, wavelengths of light photoelectrically convertible by the solar cell portion 3. When the wavelengths in the specified range include the wavelengths of sunlight with higher irradiation intensity, the solar cell module 100 can have higher photoelectric conversion efficiency.

The first protective layer 1 may contain a resin material. In other words, the first protective layer 1 may be a light-transmissive resin layer. Examples of the resin used for the first protective layer 1 include thermoplastic resins such as polycarbonate, or fluorinated resins. The fluorinated resins include, for example, a fluorinated ethylene propylene (FEP) copolymer, an ethylene tetrafluoroethylene (ETFE) copolymer, and an ethylene chlorotrifluoroethylene (ECTFE) copolymer. The first protective layer 1 may include, for example, two or more resin layers. In this case, the first protective layer 1 may contain, for example, two or more different resins. When the resin for the first protective layer 1 has, for example, weather resistance, the first protective layer 1 is less likely to deteriorate, and an output from the solar cell module 100 is less likely to decrease. Weather resistance refers to, for example, the properties of the resin being less susceptible to alterations such as deformation, discoloration, or deterioration when used outdoors. For example, fluorinated resins such as FEP, ETFE, and ECTFE have weather resistance.

The first protective layer 1 has a thickness of, for example, about 0.05 to 0.5 mm. The first protective layer 1 may have, for example, a rectangular profile as viewed in plan from the front surface 100f in the negative Z-direction.

1-1-2. Second Protective Layer

The second protective layer 2 (also referred to as a back member or a back surface member) can protect, for example, the solar cell portion 3 through the back surface 100b. The second protective layer 2 includes a third surface 2f and a fourth surface 2b. The fourth surface 2b is opposite to the third surface 2f. The third surface 2f faces the second surface 1b of the first protective layer 1. In the example in FIGS. 1A and 1B, the third surface 2f faces in the positive Z-direction, and the fourth surface 2b faces in the negative Z-direction. The direction (also referred to as a first direction) in which the second surface 1b and the third surface 2f face each other is the positive Z-direction. In other words, the second surface 1b and the third surface 2f are spaced from each other in the positive Z-direction as the first direction.

The second protective layer 2 may contain a resin material. Examples of the resin for the second protective layer 2 include thermoplastic resins such as polycarbonate, or fluorinated resins such as FEP, ETFE, or ECTFE. The second protective layer 2 may contain, for example, one of, or at least one selected from the group consisting of polyvinyl fluoride (PVF), polyethylene terephthalate (PET), and polyethylene naphthalate (PEN). The second protective layer 2 may include, for example, two or more resin layers. In this case, the second protective layer 2 may contain, for example, two or more different resins.

The second protective layer 2 has a thickness of, for example, about 0.05 to 0.5 mm. The second protective layer 2 may have, similarly to the first protective layer 1, a rectangular profile, for example, as viewed through in plan from the front surface 100f in the negative Z-direction.

1-1-3. Solar Cell Portion

The solar cell portion 3 is located, for example, between the second surface 1b of the first protective layer 1 and the third surface 2f of the second protective layer 2. From another perspective, the solar cell portion 3 is located, for example, in an area (also referred to as a gap) 100g between the second surface 1b of the first protective layer 1 and the third surface 2f of the second protective layer 2. The solar cell portion 3 includes, for example, one or more solar cell elements 31. In other words, one or more solar cell elements 31 are located, for example, between the second surface 1b of the first protective layer 1 and the third surface 2f of the second protective layer 2. In the first embodiment, the solar cell portion 3 includes multiple solar cell elements 31. In this case, for example, the multiple solar cell elements 31 are located between the second surface 1b of the first protective layer 1 and the third surface 2f of the second protective layer 2. The multiple solar cell elements 31 are, for example, arranged two-dimensionally. In the example in FIGS. 1A and 1B, the multiple solar cell elements 31 are planarly arranged along the second surface 1b of the first protective layer 1.

The solar cell portion 3 includes, for example, multiple first wiring members 32 and multiple second wiring members 33. The solar cell portion 3 includes, for example, multiple (ten in this example) solar cell strings 30. The solar cell strings 30 include, for example, multiple (seven in this example) solar cell elements 31 and multiple first wiring members 32. The multiple first wiring members 32 each electrically connect, for example, the adjacent solar cell elements 31 of the multiple solar cell elements 31. The multiple second wiring members 33 electrically connect, for example, the adjacent solar cell strings 30 of the multiple solar cell strings 30. In the example in FIGS. 1A and 1B, the second wiring member 33 connected to the solar cell string 30 at a far end in the negative X-direction, and the second wiring member 33 connected to the solar cell string 30 at a far end in the positive X-direction are extended outside the module body 120. In this example, the two second wiring members 33 may be extended outside the module body 120 through, for example, through-holes in the second protective layer 2, the adhesive layer 5, and the substrate 6. The two second wiring members 33 may be extended outside the module body 120 from, for example, the sides of the gap 100g without passing through the second protective layer 2.

Figure 2A:
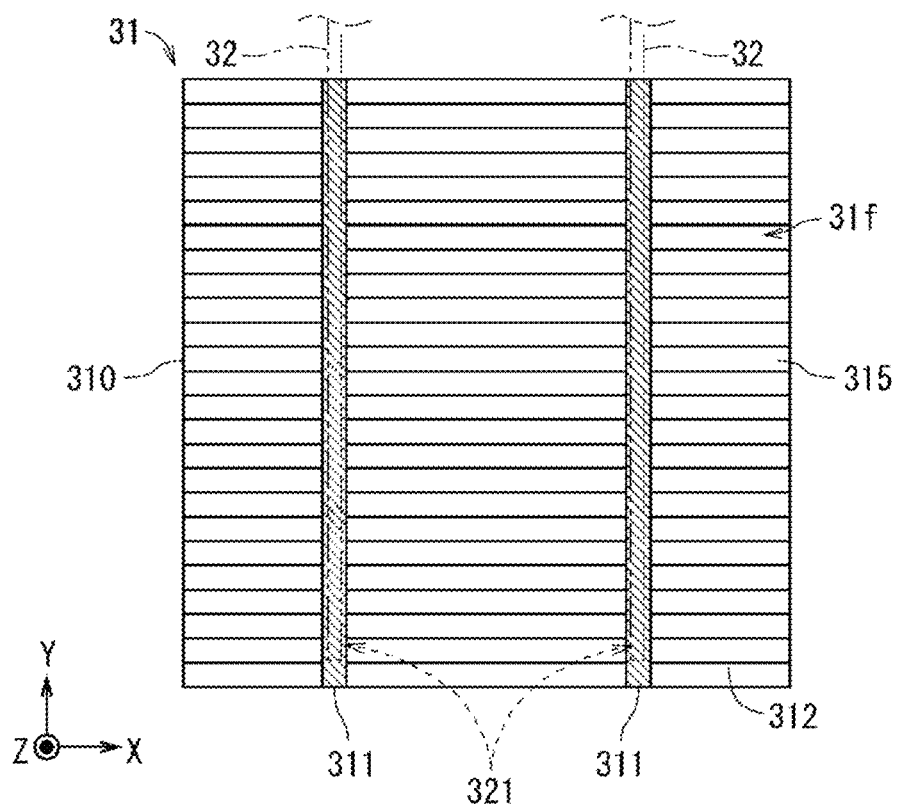
FIG. 2A illustrates a view of a solar cell element as its first cell surface is viewed in plan, illustrating its example structure.
Figure 2B:
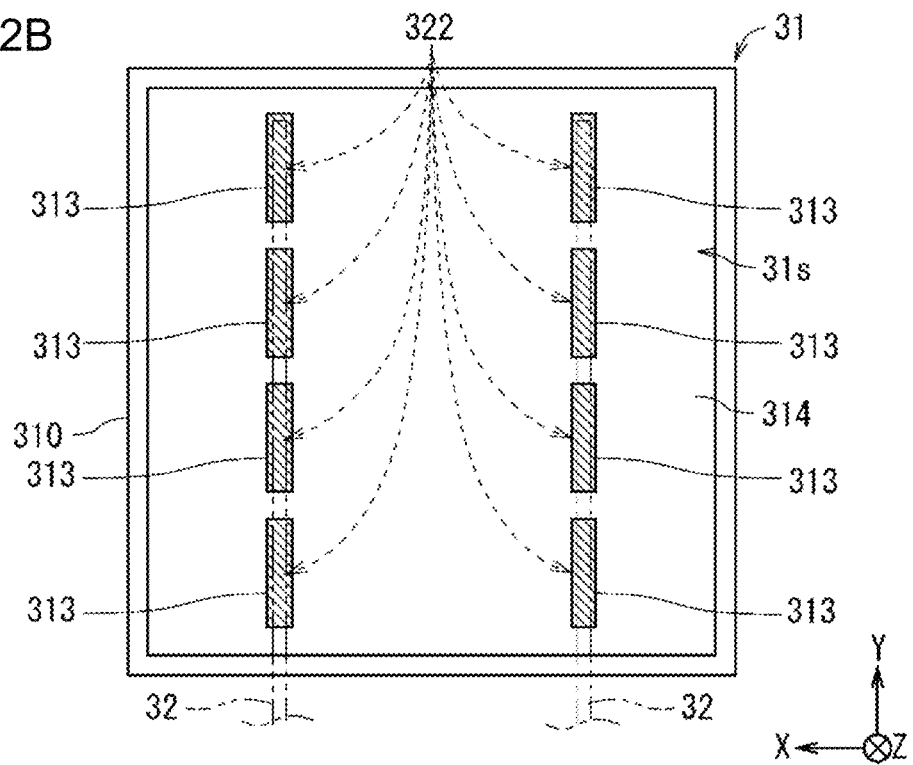
FIG. 2B illustrates a view of the solar cell element as its second cell surface is viewed in plan, illustrating its example structure.

The multiple solar cell elements 31 each can convert, for example, light energy to electrical energy. As illustrated in FIGS. 2A and 2B, the multiple solar cell elements 31 each have a surface (also referred to as a first cell surface) 31f located on its front surface, and a surface (also referred to as a second cell surface) 31s opposite to the first cell surface 31f. In the example in FIGS. 2A and 2B, the first cell surface 31f faces in the positive Z-direction, and the second cell surface 31s faces in the negative Z-direction. In this case, for example, the first cell surface 31f serves as a surface (also referred to as a front surface or a light receiving surface) to mainly receive incident light. In the first embodiment, as illustrated in FIGS. 2A and 2B, the multiple solar cell elements 31 each include a semiconductor substrate 310, first output electrodes 311, first current-collecting electrodes 312, second output electrodes 313, and a second current-collecting electrode 314.

The semiconductor substrate 310 may include, for example, a crystalline semiconductor such as crystalline silicon, an amorphous semiconductor such as amorphous silicon, or a compound semiconductor such as a compound of four elements, copper, indium, gallium, and selenium or a compound of two elements, cadmium and tellurium. The semiconductor substrate 310 including crystalline silicon will now be described. In this case, the semiconductor substrate 310 includes an area mainly with a first conductivity type (also referred to as a first conductivity type area) and an area with a second conductivity type opposite to the first conductivity type (also referred to as a second conductivity type area). The first conductivity type area is located, for example, in an area along the second cell surface 31s of the semiconductor substrate 310 facing in the negative Z-direction. The second conductivity type area is located, for example, in an outermost area along the first cell surface 31f of the semiconductor substrate 310 facing in the positive Z-direction. When, for example, the first conductivity type is p-type, the second conductivity type is n-type. When, for example, the first conductivity type is n-type, the second conductivity type is p-type. This structure allows the semiconductor substrate 310 to have a p-n junction at an interface between the first conductivity type area and the second conductivity type area. The semiconductor substrate 310 has a thickness of, for example, about 0.1 to 0.5 mm. A surface of the semiconductor substrate 310 defining the first cell surface 31f may have, for example, a finely uneven structure (texture) to reduce reflection of incident light.

The first output electrodes 311 and the first current-collecting electrodes 312 are, for example, located on the surface of the semiconductor substrate 310 facing in the positive Z-direction and along the first cell surface 31f. The first output electrodes 311 each include, for example, a busbar electrode. The first current-collecting electrodes 312 each include, for example, a finger electrode. In the example in FIG. 2A, along the first cell surface 31f, two first output electrodes 311 are substantially parallel to each other in the positive Y-direction, and many first current-collecting electrodes 312 are substantially parallel to one another and substantially orthogonal to the two first output electrodes 311. An area in the second conductivity type area of the semiconductor substrate 310 excluding an area on which the first output electrodes 311 and the first current-collecting electrodes 312 are located may receive an insulating film as an anti-reflection film 315 containing, for example, silicon nitride. The first output electrodes 311 containing, for example, silver as its main component, may be formed by screen-printing of a silver paste applied in an intended shape and then by firing. The main component refers to the component with a ratio (also referred to as a content) that is the greatest (highest) of all the contained constituents. The silver paste may include, for example, a metal paste containing a metal powder containing silver as its main component, organic vehicles, and glass frit. When containing, for example, silver as its main component, the first current-collecting electrodes 312 may be formed by, similarly to the first output electrodes 311, screen-printing of a silver paste applied in an intended shape and then by firing. The first output electrodes 311 and the first current-collecting electrodes 312 may be formed, for example, in separate processes or in the same process.

The second output electrodes 313 and the second current-collecting electrodes 314 are located on a surface of the semiconductor substrate 310 facing in the negative Z-direction and along the second cell surface 31s. The second output electrodes 313 each include, for example, a busbar electrode. In the example in FIG. 2B, along the second cell surface 31s, two rows of the second output electrodes 313 are substantially parallel to each other in the positive Y-direction. The second current-collecting electrode 314 is on a substantially entire area on the second cell surface 31s on which no second output electrodes 313 are located, excluding a portion on which the second output electrodes 313 overlap the second current-collecting electrode 314 for connection to each other. The two rows of the second output electrodes 313 each include, for example, multiple (four in this example) electrode portions aligned in a row. The semiconductor substrate 310 may include, for example, a thin film as a passivation film of an oxide such as an aluminum oxide or a nitride in an intended pattern between the first conductivity type area of the semiconductor substrate 310 and the second output electrodes 313 and between the first conductivity type area of the semiconductor substrate 310 and the second current-collecting electrode 314. When containing, for example, silver as its main component, the second output electrodes 313 may be formed by, similarly to the first output electrodes 311, screen-printing of a silver paste applied in an intended shape and then by firing. When containing, for example, aluminum as its main component, the second current-collecting electrode 314 may be formed by screen-printing of an aluminum paste applied in an intended shape and then by firing. The aluminum paste may contain, for example, a metal paste containing a metal powder containing aluminum as its main component, organic vehicles, and glass frit.

The first wiring members 32 each electrically connect, for example, a first output electrode 311 in a first solar cell element 31 and second output electrodes 313 in a second solar cell element 31 adjacent to the first solar cell element 31. In the example in FIGS. 2A and 2B, the outer edges of the first wiring members 32 bonded to the multiple solar cell elements 31 are virtually indicated by two-dot chain lines. The first wiring members 32 are bonded to, for example, the first output electrodes 311 and the second output electrodes 313. More specifically, for example, a portion (also referred to as a first bonding portion) 321 between the first wiring members 32 and the first output electrodes 311 bonds the first wiring members 32 to the first output electrodes 311.

For example, the first wiring members 32 are thus bonded to the first output electrodes 311 in the first solar cell element 31 with the first bonding portion 321. Also, for example, a portion (also referred to as a second bonding portion) 322 between the first wiring members 32 and the second output electrodes 313 bonds the first wiring members 32 to the second output electrodes 313. The first wiring members 32 are thus bonded to, for example, the second output electrodes 313 in the second solar cell element 31 adjacent to the first solar cell element 31 with the second bonding portion 322. The first wiring members 32 may include, for example, a linear or strip-shaped conductive metal body. The first bonding portion 321 and the second bonding portion 322 may contain, for example, an alloy having a low melting point, such as solder, or a single-component metal having a low melting point. More specifically, the solder entirely covers the first wiring members 32 including, for example, copper foil with a thickness of about 0.1 to 0.2 mm and a width of about 1 to 2 mm. The first wiring members 32 are electrically connected to the first output electrodes 311 and the second output electrodes 313 by, for example, soldering. In this case, for example, the solder between the first wiring members 32 and the first output electrodes 311 is included in the first bonding portion 321. Also, for example, the solder between the first wiring members 32 and the second output electrodes 313 is included in the second bonding portion 322.

1-1-4. Filler Layer

The filler layer 4 covers the solar cell portion 3 between the first protective layer 1 and the second protective layer 2. In other words, the filler layer 4 covers the multiple solar cell elements 31 between the first protective layer 1 and the second protective layer 2. From another perspective, the filler layer 4 covers, for example, the solar cell portion 3 and fills the gap 100g between the first protective layer 1 and the second protective layer 2.

The filler layer 4 includes, for example, a first filler layer 41 and a second filler layer 42. The first filler layer 41 is located, for example, between the first protective layer 1 and the solar cell portion 3 in the gap 100g. The first filler layer 41 entirely covers, for example, the surface of the solar cell portion 3 adjacent to the first protective layer 1. In other words, the first filler layer 41 covers, for example, one or more solar cell elements 31 between the second surface 1b of the first protective layer 1 and the solar cell portion 3. The second filler layer 42 is located, for example, between the second protective layer 2 and the solar cell portion 3 in the gap 100g. The second filler layer 42 entirely covers, for example, the surface of the solar cell portion 3 adjacent to the second protective layer 2. In other words, the second filler layer 42 covers, for example, one or more solar cell elements 31 between the third surface 2f of the second protective layer 2 and the solar cell portion 3. In the first embodiment, the solar cell portion 3 is thus surrounded by and held between, for example, the first filler layer 41 and the second filler layer 42. The filler layer 4 can thus, for example, maintain the posture of the solar cell portion 3.

The filler layer 4 is, for example, light transmissive. More specifically, the filler layer 4 is transmissive to, for example, light at the wavelengths in the specified range described above. For example, when at least the first filler layer 41, of the first filler layer 41 and the second filler layer 42 included in the filler layer 4, is light transmissive, incident light through the front surface 100f can reach the solar cell portion 3.

The first filler layer 41 and the second filler layer 42 may contain a resin material. In other words, the filler layer 4 includes the resin first filler layer 41 and the resin second filler layer 42. The first filler layer 41 and the second filler layer 42 each contain, for example, a resin such as EVA or an ionomer. The first filler layer 41 and the second filler layer 42 may contain, for example, two or more materials. The first filler layer 41 has a thickness of, for example, about 0.2 to 1 mm in the positive Z-direction as the first direction. The second filler layer 42 has a thickness of, for example, about 0.2 to 1 mm in the positive Z-direction as the first direction.

1-1-5. Substrate

The substrate 6 (also referred to as a support) supports, for example, the module body 120. The substrate 6 is harder than, for example, the first protective layer 1. In other words, the first protective layer 1 is softer than the substrate 6. The first protective layer 1 softer than the substrate 6 includes, for example, the first protective layer 1 having lower stiffness than the substrate 6. When, for example, having higher stiffness than the module body 120, the substrate 6 can support the module body 120 to maintain the shape of the module body 120. The relationship of relative softness and hardness between the first protective layer 1 and the substrate 6 can be calculated and evaluated based on, for example, measurements of Vickers hardness using a Vickers hardness tester for each of the first protective layer 1 and the substrate 6 set in the solar cell module 100. For example, the solar cell module 100 may be disassembled to allow the first protective layer 1 and the substrate 6 to be removed. The relationship of relative softness and hardness between the first protective layer 1 and the substrate 6 may be calculated and evaluated using a method such as mechanical testing, a resonance method, and an ultrasonic pulse method, which are used for each of the first protective layer 1 and the substrate 6. The mechanical testing includes, for example, a tensile test, a torsion test, and a compression test with specimens. A Young's modulus is easily calculated based on a slope of a stress-strain diagram obtained with the mechanical testing. With the resonance method, a mechanically or electrically forced vibration is generated in a specimen, and its resonance frequencies (natural vibration frequencies) are measured. A Young's modulus can be calculated based on the resonance frequencies. The forced vibrations include a longitudinal vibration, a transverse vibration, and a torsional vibration. The Young's modulus of the specimen can be obtained from resonance frequencies of the longitudinal vibration and the transverse vibration. A stiffness modulus (transverse elastic modulus) of the specimen can be obtained from resonance frequencies of the torsional vibration. With the ultrasonic pulse method, ultrasonic pulses with frequencies of about 1 to 20 megahertz (MHz) are generated using a longitudinal vibrator and a transverse vibrator, and the generated ultrasonic pulses propagate through the specimen. The Young's modulus and the stiffness modulus can be calculated based on the propagation velocities of the longitudinal waves and the transverse waves propagating through the specimen.

In the first embodiment, the substrate 6 is, for example, a plate-shaped member (also referred to as a plate). The substrate 6 has, for example, a fifth surface 6f and a sixth surface 6b. The sixth surface 6b is opposite to the fifth surface 6f of the substrate 6. In the example in FIGS. 1A and 1B, the fifth surface 6f faces in the positive Z-direction, and the sixth surface 6b faces in the negative Z-direction. In the first embodiment, the fifth surface 6f faces the fourth surface 2b of the second protective layer 2. Examples of the plate included in the substrate 6 include an outer panel of a movable body such as a vehicle or a marine vessel, or a roofing material or an exterior material of a building. This structure allows the solar cell module 100 to be easily mounted on, for example, a movable body such as a vehicle or a marine vessel, or a building. The plate includes, for example, a steel plate such as a plated steel plate or a stainless steel plate, or a metal plate such as an aluminum plate. The plated steel plate includes, for example, a hot-dip zinc-coated steel plate, a hot-dip zinc-aluminum alloy-coated steel plate, or other plated steel plates. When, for example, including such a metal plate, the substrate 6 can easily have higher stiffness than the module body 120. The plate included in the substrate 6 may be, for example, flat or slightly curved. The substrate 6 has a thickness of, for example, about 0.5 mm to several centimeters (cm).

1-1-6. Adhesive Layer

The adhesive layer 5 bonds, for example, the module body 120 to the substrate 6. In the first embodiment, the adhesive layer 5 is located, for example, between the fourth surface 2b of the second protective layer 2 and the fifth surface 6f of the substrate 6. The adhesive layer 5 thus bonds, for example, the fourth surface 2b and the fifth surface 6f together. The adhesive layer 5 includes, for example, an adhesive tape, or a resin such as EVA or an ionomer. The adhesive tape includes, for example, a support and an adhesive on the two surfaces of the support. When the support is, for example, strip-shaped, its two surfaces are a top surface (also referred to as a first surface or a front surface) of the strip-shaped support and a surface (also referred to as a second surface or a back surface) opposite to the front surface. The adhesive layer 5 has a thickness of, for example, about 0.1 to 1 mm in the positive Z-direction as the first direction.

1-2. Impact Resistance of Solar Cell Module

In the solar cell module 100 with the above structure, for example, one or more of the second filler layer 42, the second protective layer 2, and the adhesive layer 5 having a higher Young's modulus than the first filler layer 41 can increase the stiffness of at least one of the layers between the solar cell elements 31 and the substrate 6. When, for example, falling objects such as hailstones or flying objects caused by strong winds hit the first surface 1f of the resin first protective layer 1 softer than a glass substrate, a portion between the solar cell elements 31 and the substrate 6 is less likely to deform locally. The solar cell elements 31 are thus, for example, less likely to deform locally and crack. This can increase, for example, the impact resistance of the solar cell module 100 including the resin first protective layer 1. Although the first protective layer 1 includes, for example, a resin member to reduce the weight of the solar cell module 100, one or more of the second filler layer 42, the second protective layer 2, and the adhesive layer 5 having a higher Young's modulus than the first filler layer 41 can increase the impact resistance of the solar cell module 100. This can thus reduce, for example, the weight of the solar cell module 100 and increase its impact resistance.

For example, the second filler layer 42 may have a higher Young's modulus than the first filler layer 41. More specifically, with, for example, the first filler layer 41 containing EVA and the second filler layer 42 containing an ionomer, the second filler layer 42 can have a higher Young's modulus than the first filler layer 41. The ionomer may be, for example, Himilan (a registered trademark) manufactured by Dow-Mitsui Polychemicals. The ionomer may be, for example, an ethylene unsaturated carboxylic acid copolymer ionomer. The ethylene unsaturated carboxylic acid copolymer ionomer can be obtained by, for example, reacting the ethylene unsaturated carboxylic acid copolymer with a metal compound. This can thus increase, for example, the stiffness of the second filler layer 42 located immediately adjacent to the surface of the solar cell elements 31 facing the substrate 6. When, for example, falling objects or flying objects hit the first surface 1f of the first protective layer 1, the second filler layer 42 is less likely to deform locally. The solar cell elements 31 are, for example, less likely to deform locally and crack. This can thus increase, for example, the impact resistance of the solar cell module 100 including the resin first protective layer 1.

The adhesive layer 5 may have, for example, a higher Young's modulus than the first filler layer 41. More specifically, with, for example, the first filler layer 41 containing EVA and the adhesive layer 5 including an ionomer, the adhesive layer 5 can have a higher Young's modulus than the first filler layer 41. The ionomer may be, for example, Himilan (a registered trade name) manufactured by Dow-Mitsui Polychemicals. The ionomer may be, for example, an ethylene unsaturated carboxylic acid copolymer ionomer. For example, the adhesive layer 5 containing an adhesive of a mixture of two liquids (also referred to as a two-part adhesive) can have a higher Young's modulus than the first filler layer 41. This can increase, for example, the stiffness of the adhesive layer 5 between the solar cell elements 31 and the substrate 6. When, for example, falling objects or flying objects hit the first surface 1f of the first protective layer 1, the adhesive layer 5 is less likely to deform locally. The solar cell elements 31 are thus, for example, less likely to deform locally and crack. This can thus increase, for example, the impact resistance of the solar cell module 100 including the resin first protective layer 1.

The solar cell module 100 according to the first embodiment includes the resin first protective layer 1 in place of a glass substrate as a front member to, for example, reduce the weight of the solar cell module 100.

The surface of such a glass substrate may have higher roughness due to, for example, a roll used for preparing the glass substrate with a rough outer circumferential surface. The surface of the glass substrate has an arithmetic mean roughness (Ra) of, for example, about several to several hundred micrometers. In the solar cell elements 31, for example, the surface of the semiconductor substrate 310 adjacent to the first cell surface 31f having a finely uneven structure (texture) can increase the roughness of the first cell surface 31f to a certain degree. The first cell surface 31f has an Ra of, for example, about a hundred to several hundred nanometers. In contrast, the surface of the resin first protective layer 1 having lower roughness than that of the glass substrate may have an Ra of, for example, about several to several ten nanometers.

With, for example, the front member including the resin first protective layer 1 less rough and flatter than the glass substrate in place of the glass substrate, the front member and the first filler layer 41 can have a smaller contact area. This may easily cause, for example, separation between the front member and the first filler layer 41. Falling objects or flying objects hitting the first surface 1f can thus cause, for example, separation between the first protective layer 1 and the first filler layer 41, and then misalignment between the first protective layer 1 and the first filler layer 41. This can decrease the stiffness of the entire solar cell module 100. When, for example, falling objects or flying objects hit the first surface 1f of the first protective layer 1, the solar cell elements 31 may thus deform locally and crack. This can decrease the impact resistance of the solar cell module 100.

In the first embodiment, for example, an interface (also referred to as a first interface) 10 between the first protective layer 1 and the first filler layer 41 may have lower roughness (also referred to as first roughness) than roughness (also referred to as a second roughness) of an interface (also referred to as second interface) 20 between the first filler layer 41 and one or more solar cell elements 31. The Ra of the first interface 10 and the second interface 20 was obtained both before and after the solar cell module 100 was placed in a hot and humid environment. The obtained Ra of the first interface 10 was about from 5 to 15 nm. The obtained Ra of the second interface 20 was about from 150 to 250 nm. The solar cell modules 100 were cut along the XZ plane. Each cross-sectional surface was imaged with a scanning electron microscope (SEM) or an optical microscope. The obtained images underwent image processing through, for example, binarization to detect the cross sections of the first interface 10 and the second interface 20. The Ra was then calculated based on the detected cross sections.

When, for example, the first interface 10 between the first protective layer 1 and first filler layer 41 has the first roughness lower than the second roughness of the second interface 20 between the first filler layer 41 and the one or more solar cell elements 31, the first protective layer 1 and the first filler layer 41 can have a smaller area of contact between them. For example, compared with a glass substrate as the front member, the first protective layer 1 as the front member may easily cause separation between the first protective layer 1 and the first filler layer 41, and thus breakage of the one or more solar cell elements 31. When, for example, at least one of the layers between the one or more solar cell elements 31 and the substrate 6 has higher stiffness, the solar cell elements 31 are less likely to deform locally and crack, although falling objects or flying objects hit the first surface 1f of the first protective layer 1. This can thus increase, for example, the impact resistance of the solar cell module 100 including the resin first protective layer 1. This can thus reduce, for example, the weight of the solar cell module 100 and increase its impact resistance.

Figure 3:
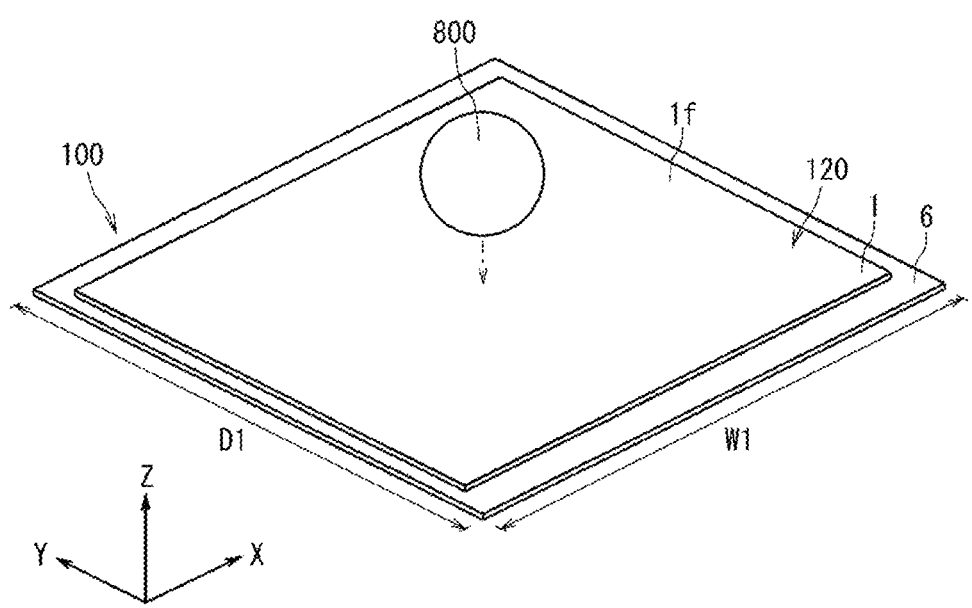
FIG. 3 illustrates a perspective view of example implementation of steel-ball drop test.

1-3. Specific Examples of Impact Resistance of Solar Cell Module 1-3-1. Simulation Results The results of simulation performed in accordance with the hailstorm test specified in Japanese Industrial Standards (JIS) C8991 will now be described. In this simulation, as illustrated in FIG. 3, a steel ball 800 as a hailstone was dropped from a position 1 meter (m) high onto the first surface 1f, and the temporal change of the maximum value of principal stress (also referred to as maximum principal stress) generated in the solar cell elements 31 was obtained. The steel ball 800 is a sphere with a diameter of 38 mm. The two facing sides of the substrate 6 in the X direction have a length (also referred to as a width) W1 of 200 mm. The two facing sides of the substrate 6 in the Y direction and facing each other have a length (also referred to as a depth) D1 of 200 mm. The solar cell module 100 is a stack simply including the adhesive layer 5, the second protective layer 2, the second filler layer 42, a layer of the solar cell elements 31, the first filler layer 41, and the first protective layer 1 on the substrate 6 in this order for convenience. The substrate 6 is an iron plate with a thickness of 0.7 mm. The adhesive layer 5 is an adhesive tape or a layer of EVA or an ionomer with a thickness of 0.4 mm. The second protective layer 2 is a layer of PET with a thickness of 0.2 mm. The second filler layer 42 is a layer of EVA with a thickness of 0.31 mm. Each solar cell element 31 is a layer of crystalline silicon with a thickness of 0.18 mm. The first filler layer 41 is a layer of EVA with a thickness of 0.51 mm. The first protective layer 1 is a layer of FEP with a thickness of 0.10 mm. Each thickness is a thickness in the positive Z-direction as the first direction. When hitting the first surface 1f, the steel ball 800 falls at an initial velocity of 4.43 meters per second (m/s).

Figure 4A:
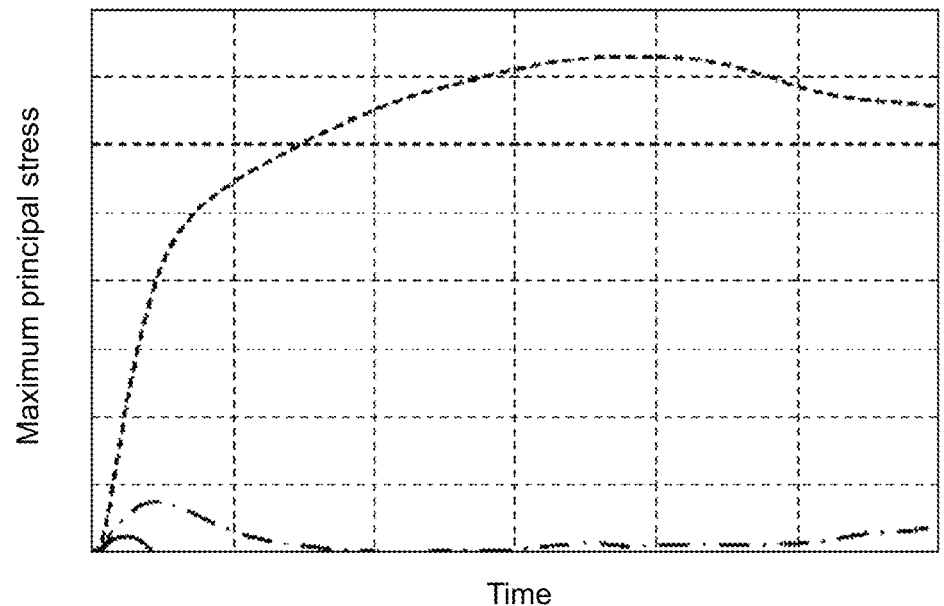
FIG. 4A illustrates a graph showing the relationship between an increase in the stiffness of a second filler layer and a temporal change of a maximum principal stress generated in the solar cell element in the steel-ball drop test.

In FIG. 4A, the simulation results of the temporal change of the maximum principal stress generated in the layer of the solar cell elements 31 are indicated by a bold dashed line when E2 divided by E1 (E2/E1) is 1, where E2 is the Young's modulus of the second filler layer 42, and E1 is the Young's modulus of the first filler layer 41. In FIG. 4A, the simulation results of the temporal change of the maximum principal stress generated in the layer of the solar cell elements 31 are indicated by a bold dot-dash line when E2/E1 is 20. In FIG. 4A, the simulation results of the temporal change of the maximum principal stress generated in the layer of the solar cell elements 31 are indicated by a bold solid line when E2/E1 is 50. As shown in FIG. 4A, as the second filler layer 42 has a Young's modulus (E2) higher than the Young's modulus (E1) of the first filler layer 41, a smaller maximum principal stress is shown to be generated in the solar cell elements 31. Thus, with, for example, the second filler layer 42 having a higher Young's modulus than the first filler layer 41 to increase the stiffness of the second filler layer 42, the solar cell elements 31 are expected to be less likely to deform locally and crack, although falling objects or flying objects hit the first surface 1f of the first protective layer 1.

Figure 4B:
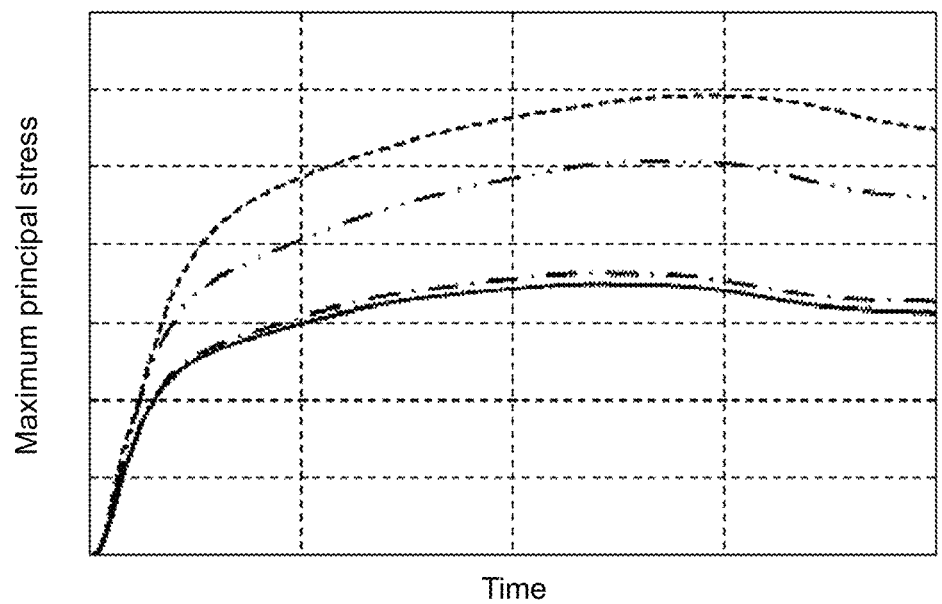
FIG. 4B illustrates a graph showing the relationship between an increase in the stiffness of an adhesive layer and a temporal change of a maximum principal stress generated in the solar cell element in the steel-ball drop test.

In FIG. 4B, the simulation results of the temporal change of the maximum principal stress generated in the layer of the solar cell elements 31 are indicated by a bold dashed line when E5 divided by E1 (E5/E1) is 1, where E5 is the Young's modulus of the adhesive layer 5, and E1 is the Young's modulus of the first filler layer 41. In FIG. 4B, the simulation results of the temporal change of the maximum principal stress generated in the layer of the solar cell elements 31 are indicated by a bold two-dot chain line when E5/E1 is 10. In FIG. 4B, the simulation results of the temporal change of the maximum principal stress generated in the layer of the solar cell elements 31 are indicated by a bold dot-dash line when E5/E1 is 285. In FIG. 4B, the simulation results of the temporal change of the maximum principal stress generated in the layer of the solar cell elements 31 are indicated by a bold solid line when E5/E1 is 1000. As shown in FIG. 4B, as the adhesive layer 5 has a Young's modulus (E5) higher than the Young's modulus (E1) of the first filler layer 41, a smaller maximum principal stress is shown to be generated in the solar cell elements 31. Thus, with, for example, the adhesive layer 5 having a higher Young's modulus than the first filler layer 41 to increase the stiffness of the adhesive layer 5, the solar cell elements 31 are expected to be less likely to deform locally and crack, although falling objects or flying objects hit the first surface 1f of the first protective layer 1. As shown in FIG. 4B, with the adhesive layer 5 having a Young's modulus (E5) relatively higher than a Young's modulus (E1) of the first filler layer 41, the maximum principal stress is shown to be less likely to decrease relative to the increase in the Young's modulus (E5) of the adhesive layer 5. With, for example, the adhesive layer 5 having a higher Young's modulus (E5) to reduce cracks in the solar cell elements 31, the range of the Young's modulus (E5) of the adhesive layer 5 to the Young's modulus (E1) of the first filler layer 41 may be set as appropriate to increase the Young's modulus (E5) of the adhesive layer 5.

As shown in FIGS. 4A and 4B, with the second filler layer 42 having a Young's modulus (E2) higher than the Young's modulus (E1) of the first filler layer 41 rather than with the adhesive layer 5 having a Young's modulus (E5) higher than the Young's modulus (E1) of the first filler layer 41, the maximum principal stress generated in the solar cell elements 31 is shown to tend to be smaller. Thus, when, for example, the second filler layer 42 located immediately adjacent to the surface of the solar cell elements 31 facing the substrate 6 has higher stiffness in the solar cell elements 31, the solar cell elements 31 are expected to be further less likely to deform locally and crack, although falling objects or flying objects hit the first surface 1f of the first protective layer 1.

1-3-2. Experimental Results

The results from an experiment simulating the hailstorm test specified in JIS C8991 will now be described. In the experiment, the steel ball 800 as a hailstone was dropped from multiple different heights onto the first surface 1f, and a test (also referred to as a solar cell electroluminescence test) was conducted. In the test, the luminescence (electroluminescence, or EL) on the first cell surface 31f was photographed by an image sensor while a constant current was being applied between the two second wiring members 33 extended outside the module body 120. The multiple heights were 11, 50, 100, 125, 150, and 190 cm in the height direction with reference to the first surface 1f. The steel ball 800 is a sphere with a diameter of 38 mm. The substrate 6 is an iron plate with a thickness of 0.7 mm. The second protective layer 2 is a layer of PET with a thickness of 0.2 mm. The second filler layer 42 is a layer of EVA with a thickness of 0.4 mm. The semiconductor substrate 310 in each solar cell element 31 contains a crystalline silicon layer with a thickness of 0.18 mm. The first filler layer 41 is a layer of EVA with a thickness of 0.6 mm. The first protective layer 1 is a layer of FEP with a thickness of 0.10 mm. The solar cell module 100 containing an adhesive layer 5 of adhesive tape with a thickness of 0.4 mm, and the solar cell module 100 containing an adhesive layer 5 of an ionomer layer with a thickness of 0.4 mm were used. Each thickness is a thickness in the positive Z-direction as the first direction. A 3M (a registered trademark) VHB (a registered trademark) tape product manufactured by 3M Company was used as the adhesive tape Himilan (a registered trademark) manufactured by Dow-Mitsui Polychemicals was used as an ionomer. The adhesive layer 5 being the adhesive tape had a lower Young's modulus than a Young's modulus of the first filler layer 41 of EVA. The adhesive layer 5 including the ionomer had a higher Young's modulus than the first filler layer 41 of EVA. In this experiment, with the adhesive layer 5 being the adhesive tape, the solar cell elements 31 are shown to have cracks that cause the solar cell elements 31 to be non-luminous through the solar cell EL tests conducted on the solar cell module 100, in which the steel ball 800 was dropped from multiple heights (11, 50, 100, 125, 150, and 190 cm) onto the first surface 1f. In contrast, with the adhesive layer 5 including an ionomer, the solar cell elements 31 are shown to have no such cracks through the solar cell EL tests conducted on the solar cell module 100, in which the steel ball 800 was dropped from heights equal to and less than 100 cm onto the first surface 1f. Thus, with, for example, the adhesive layer 5 having a higher Young's modulus than the first filler layer 41 to increase the stiffness of the adhesive layer 5, the solar cell elements 31 are expected to be less likely to deform locally and crack, although falling objects or flying objects hit the first surface 1f of the first protective layer 1.

In addition, with the adhesive layer 5 of an ionomer layer with a thickness of 0.1 mm, the solar cell elements 31 are shown to have cracks that cause the solar cell elements 31 to be non-luminous through the solar cell EL tests conducted on the solar cell module 100, in which the steel ball 800 was dropped from a height of 100 cm onto the first surface 1f. Thus, with the adhesive layer 5 having a thickness in addition to a Young's modulus appropriately adjusted to increase its stiffness, the solar cell elements 31 are expected to be less likely to deform locally and crack, although falling objects or flying objects hit the first surface 1f of the first protective layer 1.

1-4. Fabrication of Solar Cell Module

An example method for fabricating the solar cell module 100 will now be described with reference to FIGS. 5A to 5D.

Figure 5A:
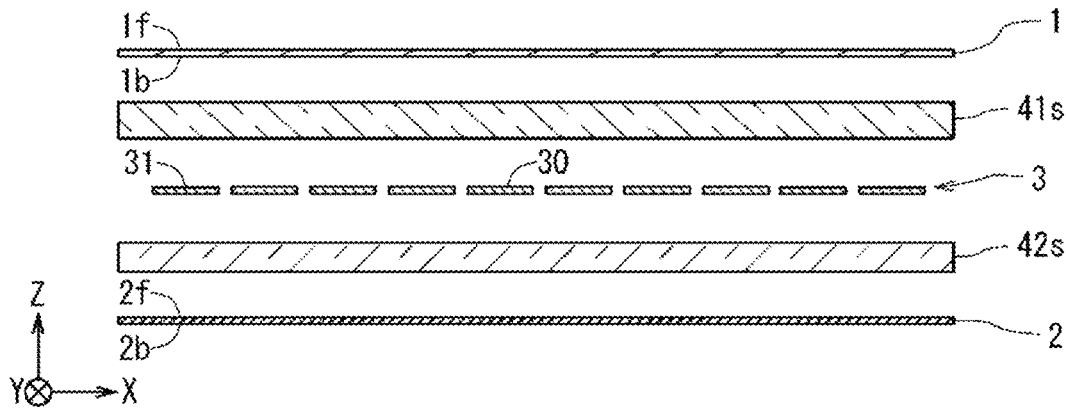
FIGS. 5A to 5D illustrate cross-sectional views of the solar cell module according to the first embodiment during fabrication, illustrating its example states.
Figure 5B:
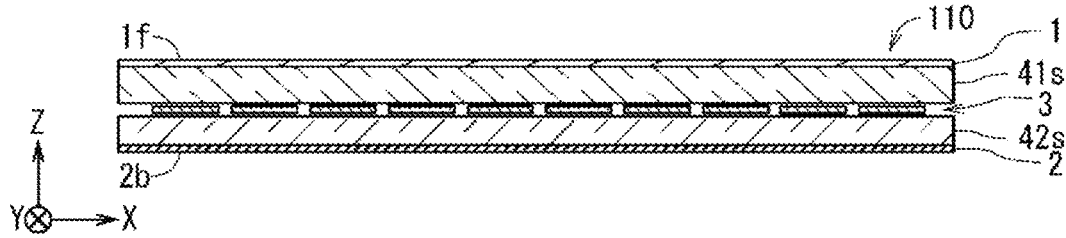

As illustrated in FIGS. 5A and 5B, the second protective layer 2, a second sheet 42s, the solar cell portion 3, a first sheet 41s, and the first protective layer 1 are stacked in this order to form a stack 110. In this state, wiring extending from the solar cell portion 3 to outside the module body 120 to be connected to, for example, a terminal box 9 is appropriately placed. The first sheet 41s is, for example, a resin (e.g., EVA) sheet to be a base of the first filler layer 41. The second sheet 42s is, for example, a resin (e.g., EVA, an ionomer, or another resin) sheet to be a base of the second filler layer 42. With, for example, the second surface 1b, or a surface of the first protective layer 1, receiving in advance a corona process or a plasma process for activating its surface, the first protective layer 1 can further adhere to the first filler layer 41 in a lamination process described later.

Figure 5C:
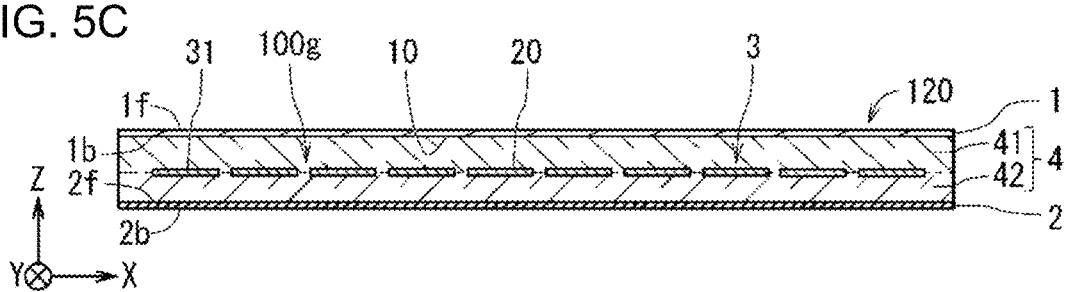

For example, the stack 110 is then laminated. The stack 110 is formed into one piece with, for example, a laminating device (laminator). In the laminator, for example, the stack 110 is placed on a heater board in a chamber, which is depressurized to about 50 to 150 pascal (Pa), and is then heated to about 100 degrees Celsius (100° C.) to 200° C. The first sheet 41s and the second sheet 42s are then heated to be flowable to a certain degree. In this state, with the stack 110 being pressed with, for example, a diaphragm sheet, cross-linking of the resin inside the first sheet 41s and the second sheet 42s proceeds to form the stack 110 into one piece. As illustrated in FIG. 5C, this can thus complete the module body 120.

Figure 5D:
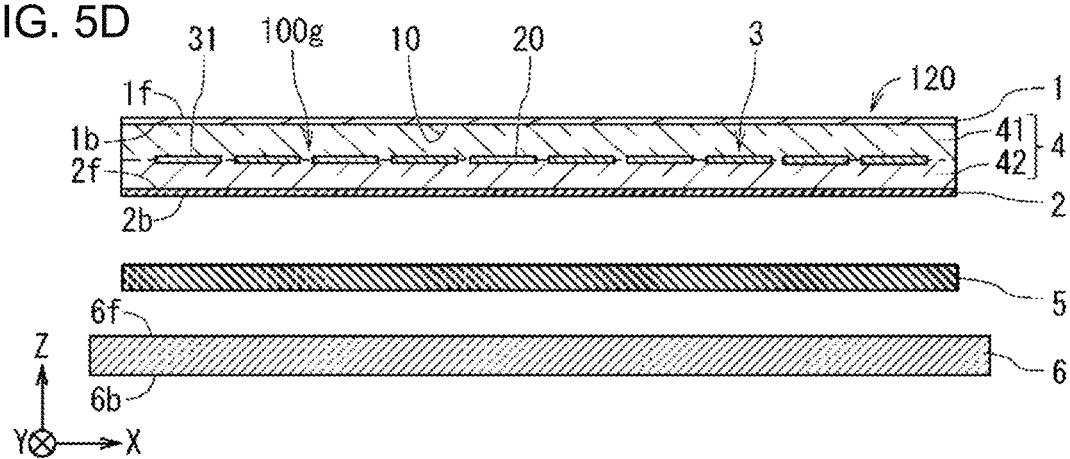

Then, as illustrated in FIG. 5D for example, the module body 120 is bonded to the substrate 6 with the adhesive layer 5, thus completing the solar cell module 100 as illustrated in FIG. 1A and FIG. 1B.

Figure 6A:
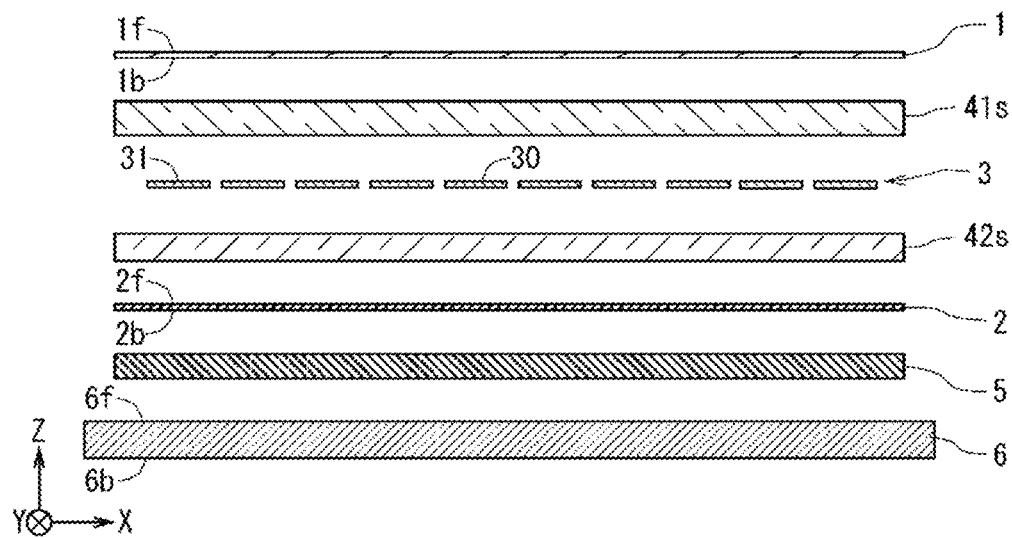
FIGS. 6A and 6B illustrate cross-sectional views of the solar cell module according to the first embodiment during fabrication, illustrating its example states.
Figure 6B:
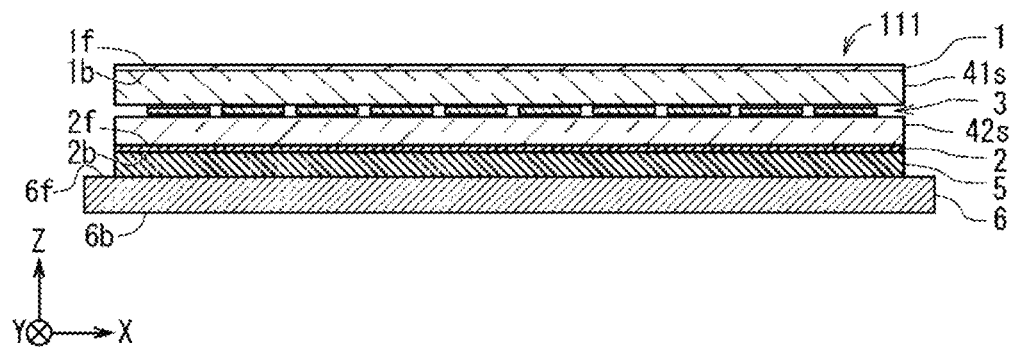

As illustrated in FIGS. 6A and 6B for example, the substrate 6, the adhesive layer 5, the second protective layer 2, the second sheet 42s, the solar cell portion 3, the first sheet 41s, and the first protective layer 1 are stacked in this order to form a stack 111, which is then laminated to fabricate the solar cell module 100.

The solar cell module 100 may then receive, for example, the terminal box 9 attached in an appropriately manner. The wiring extending from the solar cell portion 3 to outside the module body 120 may be, for example, appropriately connected to terminals in the terminal box 9. The solar cell module 100 may not include, for example, the terminal box 9.

1-5. Overview of First Embodiment

In the solar cell module 100 according to the first embodiment, for example, one or more of the second filler layer 42, the second protective layer 2, and the adhesive layer 5 between the one or more solar cell elements 31 and the substrate 6 have a higher Young's modulus than the first filler layer 41. This can thus increase, for example, the stiffness of at least one of the layers between the solar cell elements 31 and the substrate 6. When, for example, falling objects or flying objects hit the first surface 1f of the resin first protective layer 1 softer than a glass substrate, the portion between the solar cell elements 31 and the substrate 6 is less likely to deform locally. The solar cell elements 31 are thus, for example, less likely to deform locally and crack. Although, for example, the first protective layer 1 includes a resin member to reduce the weight of the solar cell module 100, this can thus increase the impact resistance of the solar cell module 100. This can thus reduce, for example, the weight of the solar cell module 100 and increase its impact resistance.

2. Other Embodiments

The present disclosure is not limited to the above first embodiment and may be changed or modified variously without departing from the spirit and scope of the present disclosure.

In the above first embodiment, at least one of the second filler layer 42 or the adhesive layer 5 may be, for example, a layer in which many granules harder than the resin are dispersed in the resin. For example, at least one of the second filler layer 42 or the adhesive layer 5 may thus have a higher Young's modulus than the first filler layer 41. The many granules include, for example, an insulating inorganic filler or an organic filler. The many granules have a diameter of, for example, about several nanometers to several micrometers. In preparing the second sheet 42s to be a base of the second filler layer 42, for example, many granules are added to the resin to cause the many granules to be dispersed in the resin contained in the second filler layer 42. The structure can easily increase, for example, the stiffness of the second filler layer 42 located immediately adjacent to the surface of the solar cell elements 31 facing the substrate 6. This can thus, for example, easily increase the impact resistance of the solar cell module 100 including the resin first protective layer 1. When, for example, the adhesive layer 5 is a resin sheet, many granules are added to the resin to cause the many granules to be dispersed in the resin contained in the adhesive layer 5 in preparing a resin sheet to be a base of the adhesive layer 5.

In the above first embodiment, for example, with the second filler layer 42 containing resin having a higher cross-linking rate than the resin contained in the first filler layer 41, the second filler layer 42 can have a higher Young's modulus than the first filler layer 41. In fabricating the solar cell module 100 for example, the stack 110 or the stack 111 may be placed on the heater board in the laminator to cause the second protective layer 2 to be nearer the heater board than the first protective layer 1. This can thus, for example, further facilitate cross-linking in the second sheet 42s than in the first sheet 41s to cause the resin contained in the second filler layer 42 to have a higher cross-linking rate than the resin contained in the first filler layer 41. When, for example, the adhesive layer 5 contains a resin, with the adhesive layer 5 containing a resin having a higher cross-linking rate than the resin contained in the first filler layer 41, the adhesive layer 5 can have a higher Young's modulus than the first filler layer 41. In other words, for example, at least one of the second filler layer 42 or the adhesive layer 5 may contain a resin having a higher cross-linking rate than the resin contained in the first filler layer 41.

In the above first embodiment, for example, the second filler layer 42 thinner than the first filler layer 41 in the positive Z-direction as the first direction. When, for example, falling objects or flying objects hit the first surface 1f of the first protective layer 1, the second filler layer 42 located immediately under the solar cell elements 31 can have shallower dents. The solar cell elements 31 are thus, for example, less likely to deform locally and crack. This can thus increase, for example, the impact resistance of the solar cell module 100 including the resin first protective layer 1.

In the above first embodiment, for example, the substrate 6 may be a plate including a material other than a metal. Materials other than a metal include, for example, a resin, a ceramic, concrete, wood, or other materials. The substrate 6 may have, for example, a shape other than a plate. Shapes other than a plate include, for example, a block or other shapes.

In the above first embodiment, for example, with the first protective layer 1 and the second protective layer 2 bonded to each other in the outer periphery of the module body 120, the gap 100g between the first protective layer 1 and the second protective layer 2 may be sealed. With, for example, a sealant such as a butyl resin placed in the outer periphery of the module body 120, the gap 100g between the first protective layer 1 and the second protective layer 2 may be sealed.

The components described in the above first embodiment and modifications may be entirely or partially combined as appropriate unless any contradiction arises.

Sustainable Development Goals (SDGs) were adopted as the 17 international goals in United Nations Summit in September 2015. The solar cell module 100 according to the first embodiment and its modifications can contribute to achieving the goals, among the 17 SDGs, for example, 7. Affordable and clean energy, 9. Industry, innovation, and infrastructure, and 11. Sustainable cities and communities.

The invention claimed is:

1. A solar cell module, comprising:
   a first protective layer comprising a resin and being light transmissive, the first protective layer having a first surface and a second surface opposite to the first surface;
   a second protective layer having a third surface facing the second surface, and a fourth surface opposite to the third surface;
   a solar cell portion including one or more solar cells between the second surface and the third surface;
   a first filler layer covering the one or more solar cells between the second surface and the solar cell portion, the first filler layer comprising a resin;
   a second filler layer covering the one or more solar cells between the third surface and the solar cell portion, the second filler layer comprising a resin;
   a substrate having a fifth surface facing the fourth surface; and
   an adhesive layer bonding the fourth surface and the fifth surface together between the fourth surface and the fifth surface,
   wherein
   the first protective layer is softer than the substrate,
   the adhesive layer has a higher Young's modulus than the first filler layer,
   a first interface between the first protective layer and the first filler layer has a first roughness lower than a second roughness of a second interface between the first filler layer and the one or more solar cells,
   a thickness of the first protective layer is less than a thickness of the adhesive layer,
   the second filler layer includes a layer including granules harder than a resin dispersed in the resin of the second filler layer, the adhesive layer is formed of a single layer, and
the single layer is in direct contact with the fourth surface and the fifth surface to bond the fourth surface and the fifth surface together.

2. The solar cell module according to claim 1, wherein
the single layer of the adhesive layer includes an ionomer, and
the first filling layer includes ethylene-vinyl acetate (EVA).

3. The solar cell module according to claim 1, wherein
the first protective layer is a single layer having
the first surface exposed to an external space outside the solar cell module, and
the second surface opposite to the first surface,
the first interface between the first protective layer and the first filler layer is defined by an interface between the second surface of the single layer of the first protective layer and the first filler layer, and
the interface between the second surface of the single layer of the first protective layer and the first filler layer has the first roughness lower than the second roughness of the second interface between the first filler layer and the one or more solar cells.

4. The solar cell module according to claim 1, wherein the second filler layer has a higher Young's modulus than the first filler layer.

5. The solar cell module according to claim 1, wherein at least one of the second filler layer or the adhesive layer comprises a resin having a higher cross-linking rate than the resin in the first filler layer.

6. The solar cell module according to claim 1, wherein the substrate includes a plate.

7. The solar cell module according to claim 6, wherein the plate includes a plate comprising a metal.

8. The solar cell module according to claim 1, wherein the second filler layer is thinner than the first filler layer in a first direction in which the second surface and the third surface face each other.

* * * * *